US012683523B2

(12) United States Patent
Chadha

(10) Patent No.: US 12,683,523 B2
(45) Date of Patent: Jul. 14, 2026

(54) ELECTROSTATIC CHUCK WITH PERFORATED OR SCREENED CHUCKING ELECTRODE

(71) Applicant: APPLIED MATERIALS, INC., Santa Clara, CA (US)

(72) Inventor: Arvinder ManmohanSingh Chadha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 94 days.

(21) Appl. No.: 18/627,027

(22) Filed: Apr. 4, 2024

(65) Prior Publication Data

US 2025/0317077 A1      Oct. 9, 2025

(51) Int. Cl.
*H02N 13/00*          (2006.01)
*H01J 37/32*          (2006.01)
(52) U.S. Cl.
CPC ....... *H02N 13/00* (2013.01); *H01J 37/32715* (2013.01); *H01J 2237/2007* (2013.01)
(58) Field of Classification Search
CPC ........ H01J 37/32715; H01J 2237/2007; H02N 13/00
USPC ....................................................... 361/234
See application file for complete search history.

(56) References Cited

U.S. PATENT DOCUMENTS

| | | | |
|---|---|---|---|
| 2004/0040665 A1* | 3/2004 | Mizuno ................. | H02N 13/00 |
| | | | 118/728 |
| 2015/0181683 A1 | 6/2015 | Singh et al. | |
| 2021/0366759 A1 | 11/2021 | Chen et al. | |
| 2022/0108877 A1* | 4/2022 | Matsubara .......... | H01L 21/6875 |
| 2022/0301913 A1* | 9/2022 | Banda ................. | H01L 21/6875 |
| 2022/0336249 A1 | 10/2022 | Parkhe et al. | |

FOREIGN PATENT DOCUMENTS

WO      2024057973 A1      3/2024

OTHER PUBLICATIONS

International Search Report and Written Opinion for International Application No. PCT/US2025/023015, mailed Jul. 21, 2025, 10 Pages.

* cited by examiner

*Primary Examiner* — Kevin J Comber
(74) *Attorney, Agent, or Firm* — Lowenstein Sandler LLP

(57)                ABSTRACT

An electrostatic chuck includes a ceramic puck including a plurality of mesas configured to support a substrate. The electrostatic chuck further includes an electrode disposed within the ceramic puck. The electrode is configured to electrostatically clamp the substrate to the ceramic puck responsive to being energized with a clamping voltage. The electrode includes a plurality of perforations. At least one perforation of the plurality of perforations is disposed beneath at least one mesas of the plurality of mesas.

20 Claims, 10 Drawing Sheets

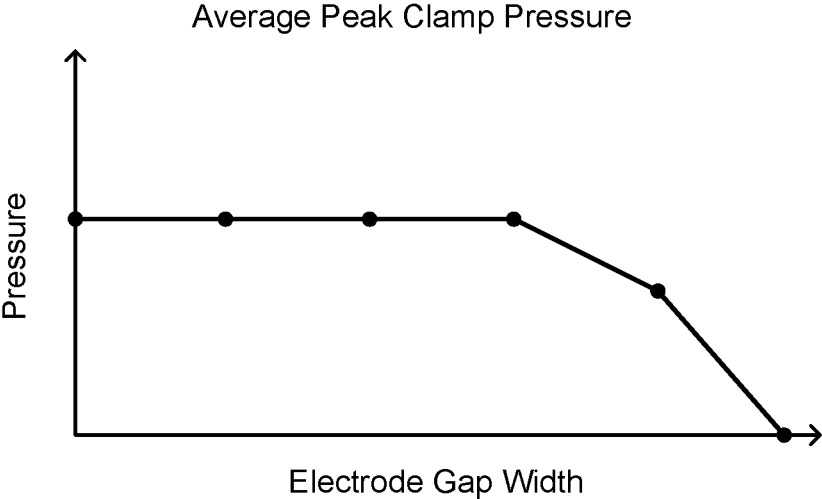
FIG. 5A
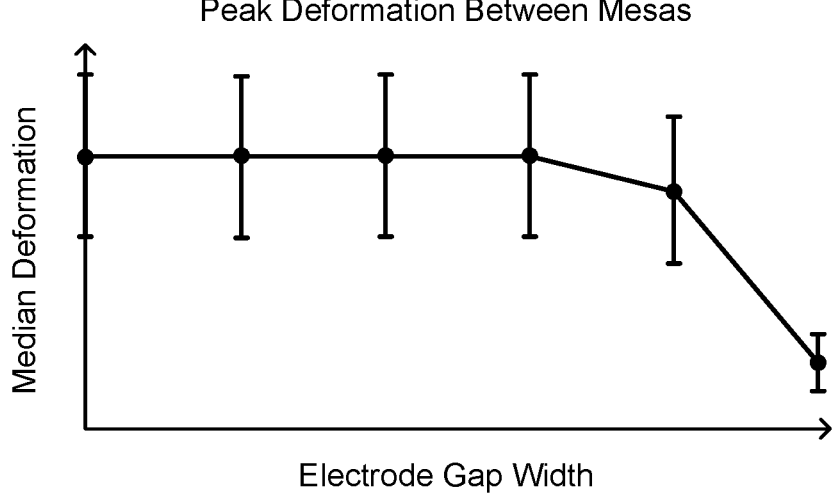
FIG. 5B

500C

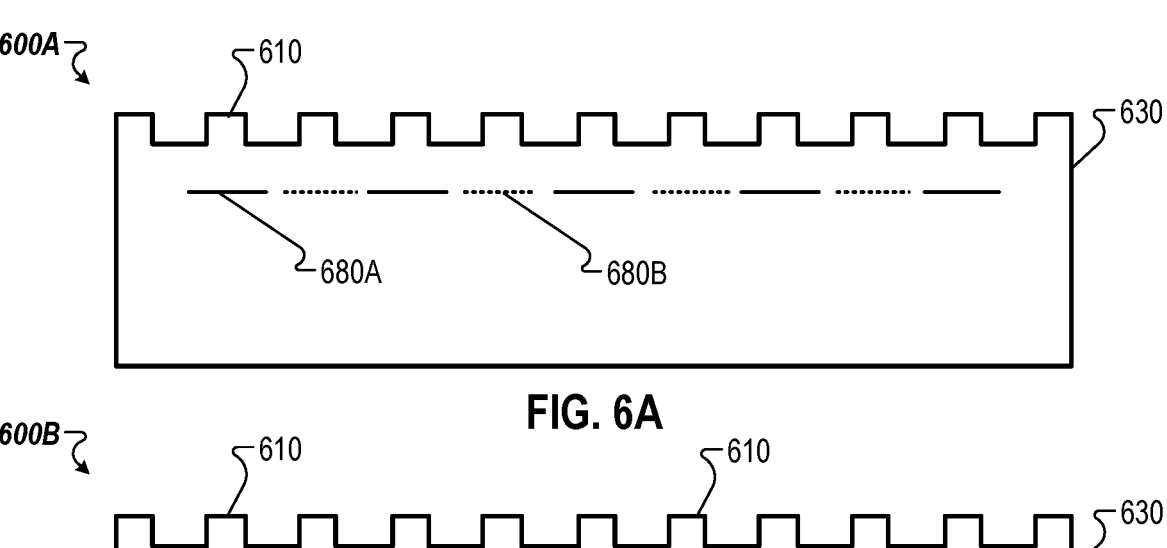
FIG. 6A
FIG. 6B
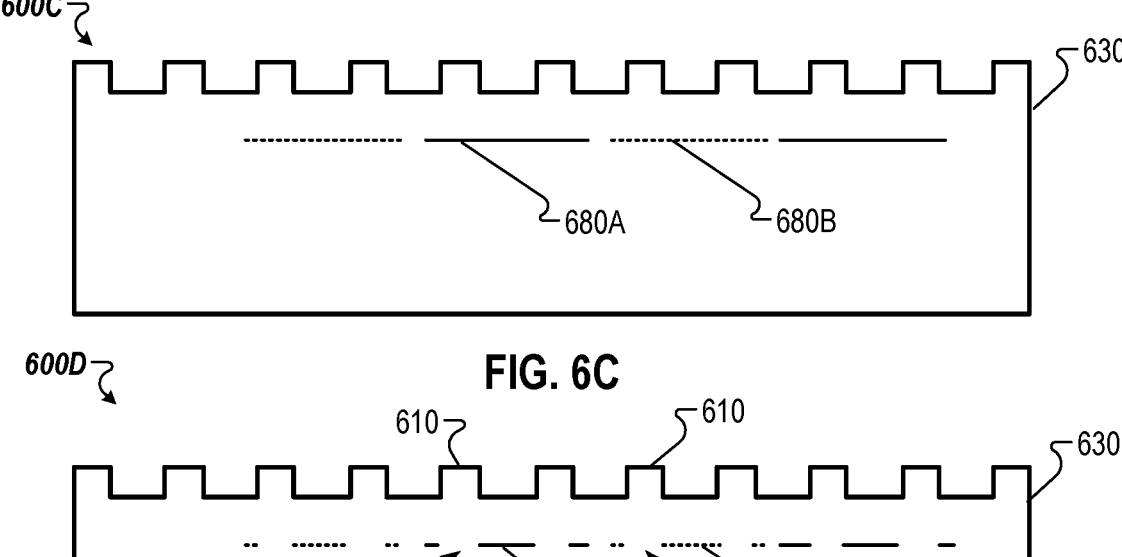
FIG. 6C
FIG. 6D

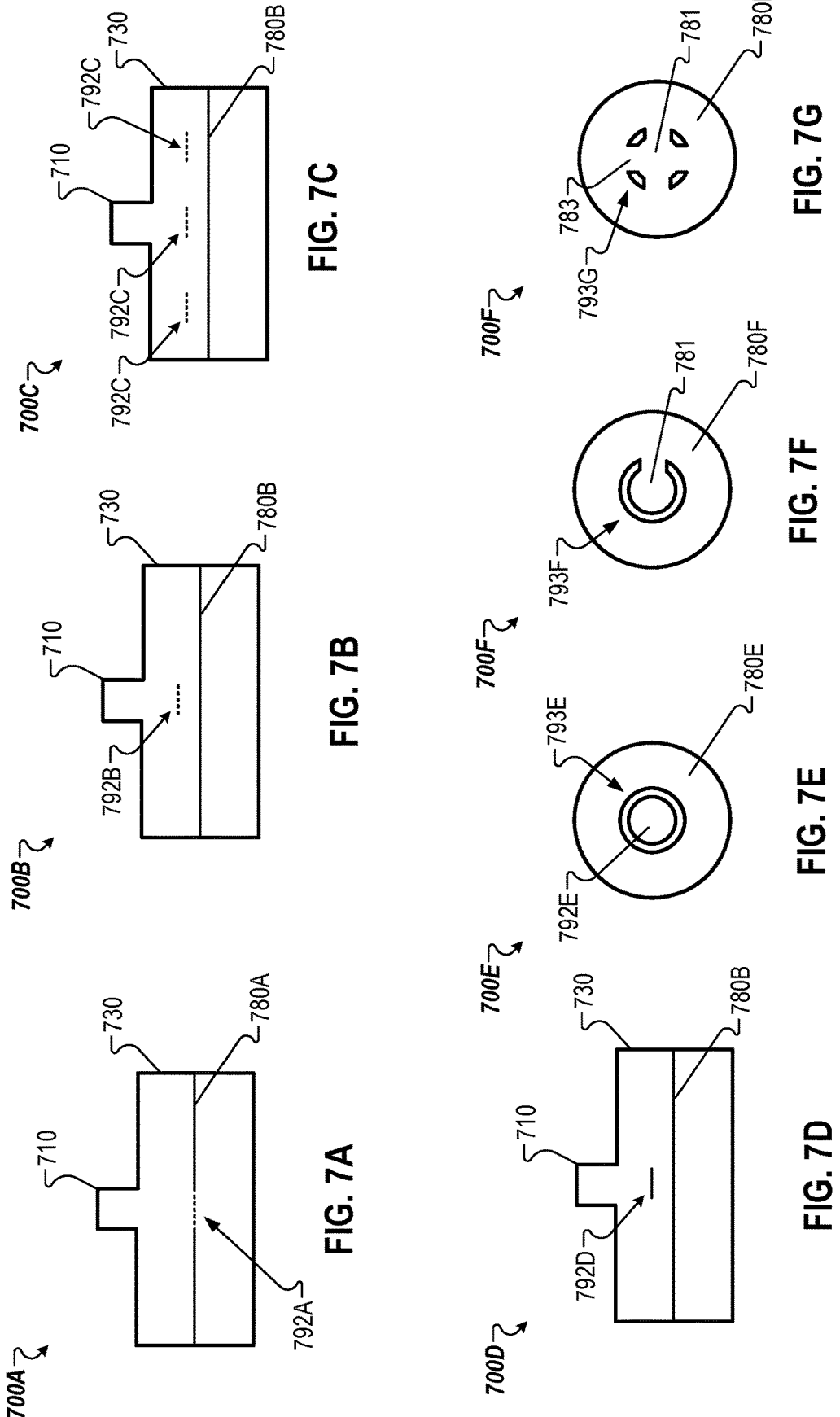

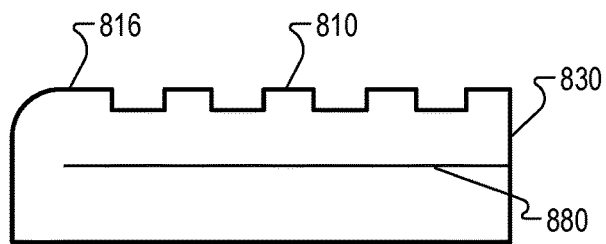
FIG. 8A
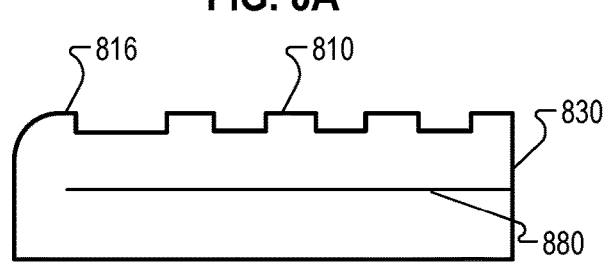
FIG. 8B
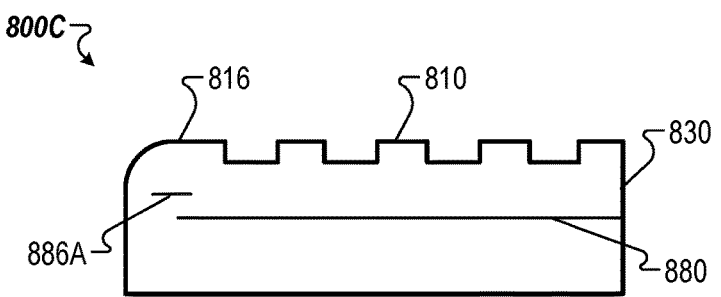
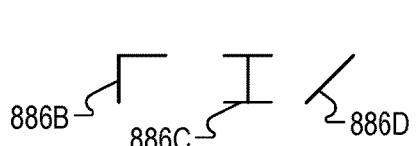
FIG. 8C
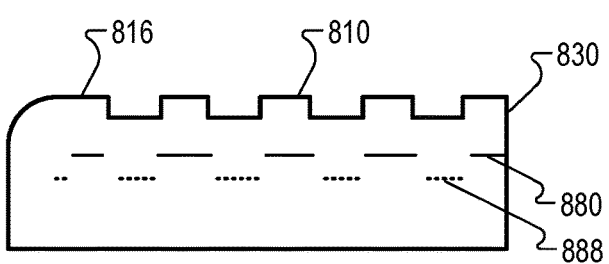
FIG. 8D

ELECTROSTATIC CHUCK WITH PERFORATED OR SCREENED CHUCKING ELECTRODE

TECHNICAL FIELD

Some embodiments of the present disclosure relate, in general, to an electrostatic chuck having a perforated chucking electrode and/or a screened chucking electrode.

BACKGROUND

Chucks are widely used to hold and secure substrates, such as semiconductor wafers, during various substrate processes like etching, deposition, and lithography. The specific type of chuck used depends on the semiconductor manufacturing process, including factors such as substrate size, material, temperature sensitivity, and process compatibility. Some commonly used chucks include vacuum chucks, electrostatic chucks, mechanical chucks, magnetic chucks, piezoelectric chucks, wafer carrier chucks, edge grip chucks, heated chucks, and coolant chucks.

Electrostatic chucks (ESCs) typically include one or more electrodes embedded within a unitary chuck body, which includes a dielectric or semi-conductive ceramic material across which an electrostatic clamping field can be generated to chuck a substrate.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Some embodiments described herein cover an electro-static chuck. The electrostatic chuck includes a ceramic puck including a plurality of mesas configured to support a substrate. The electrostatic chuck further includes an electrode disposed within the ceramic puck. The electrode is configured to electrostatically clamp the substrate to the ceramic puck responsive to being energized with a clamping voltage. The electrode includes a plurality of perforations. At least one perforation of the plurality of perforations is disposed beneath at least one mesas of the plurality of mesas.

Additional or related embodiments described herein cover an electrostatic chuck. The electrostatic chuck includes a ceramic puck including a plurality of mesas on a top surface of the ceramic puck. The electrostatic chuck further includes a chucking electrode disposed within the ceramic puck. The electrostatic chuck further includes a plurality of electrode screens disposed within the ceramic puck between the chucking electrode and the top surface of the ceramic puck. At least one electrode screen of the plurality of electrode screens is disposed beneath at least one mesa of the plurality of mesas.

Further embodiments described herein cover a process chamber. The process chamber includes an electrostatic chuck. The electrostatic chuck includes a ceramic puck including a plurality of mesas configured to support a substrate. The electrostatic chuck further includes a chucking electrode disposed within the ceramic puck and configured to electrostatically clamp the substrate to the ceramic puck. The chucking electrode comprises a plurality of perforations. At least one perforation of the plurality of perforations is disposed beneath at least one mesa of the plurality of mesas.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 5A-5D are charts depicting the performance of an electrostatic chuck with perforated a perforated electrode, according to aspects of the present disclosure.

FIGS. 6A-6E depict an electrostatic chuck and bi-polar perforated electrode, according to aspects of the present disclosure.

FIGS. 7A-G depict an electrostatic chuck having a screened chucking electrode, according to aspects of the present disclosure.

FIGS. 8A-8D depict an electrostatic chuck having a screened chucking electrode proximate the seal band, according to aspects of the present disclosure.

DETAILED DESCRIPTION OF EMBODIMENTS

Figure 1:
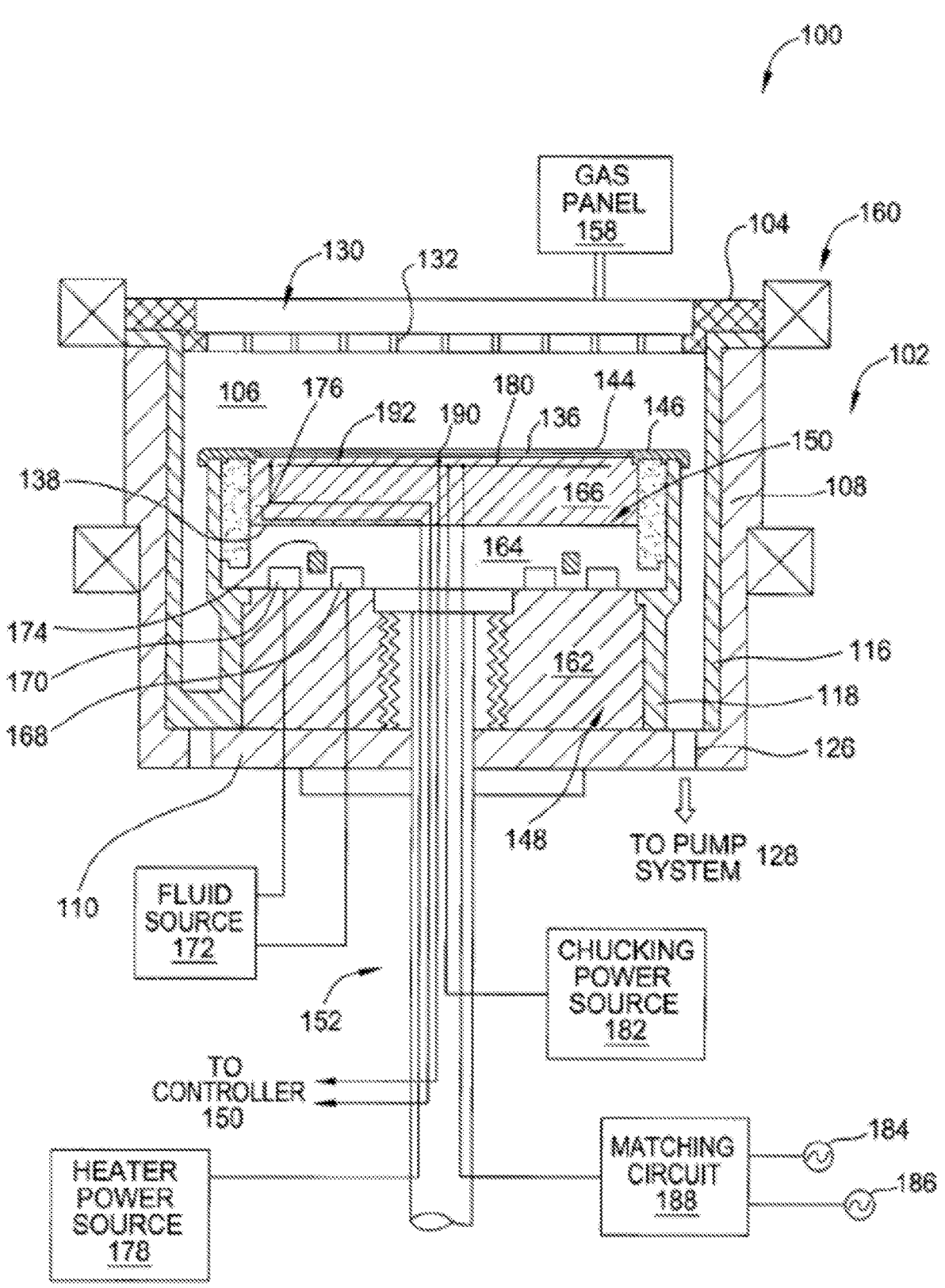
FIG. 1 depicts a sectional side view of one embodiment of a processing chamber, according to aspects of the present disclosure.

Embodiments described herein are related to an electro-static chuck having a perforated or screened chucking electrode. The electrostatic chuck may be configured for electrostatically securing a substrate for processing.

Substrates often undergo processes such as an etching process, a deposition process, a lithography process, a plasma-based process, and/or some other process. At least some processes can occur within a process chamber. To secure the substrate for processing, the substrate can be placed on a substrate support having an electrostatic chuck to electrostatically secure the substrate on the substrate support. Conventional electrostatic chucks include a ceramic puck having a chucking electrode within the puck. The chucking electrode can be energized with a chucking voltage. When energized, the chucking electrode induces an electrostatic clamping force between the puck and the substrate. The electrostatic clamping force may secure the substrate to the substrate support so that the substrate does not move during processing.

A ceramic puck used in electrostatic chucks may include a lattice of mesas on a top surface of the puck. The substrate may be supported on top of the mesas. Conventionally, excessive chucking voltage may be applied to the chucking electrode to electrostatically clamp the substrate to the top of the ceramic puck (e.g., to the surfaces of the mesas on top of the ceramic puck). Such excessive chucking voltage ensures the substrate does not move during processing and that the substrate contacts a seal band around the periphery of the ceramic puck (if such a seal band exists). However, the excessive chucking voltage can cause the substrate to become damaged. For example, the excessive chucking voltage can induce excessive chucking (e.g., clamping) force on the substrate. The substrate can be clamped so tightly to the ceramic puck that the mesas cause indentations and/or other damage to the bottom of the substrate. The mesas can cause pitting and/or scratching to the bottom of the substrate when the excessive chucking voltage is used. Additionally, the pitting and/or scratching can lead to material buildup on the bottom of the substrate. The material (e.g., small particles, etc.) can fall off of the substrate in the process chamber and/or during transport which can cause contamination of other substrate(s). Moreover, the excessive force caused by the excessive chucking voltage can cause the substrate to bend at regions between the mesas of the ceramic puck (e.g., at regions not supported by the mesas). Subsequent processing operations may be adversely affected if the substrate is bent, particularly where the subsequent processing operations are lithography-based operations. An electrostatic chuck that mitigates the effects of excessive chucking voltage to reduce the chucking force to a substrate may be advantageous if the substrate can remain securely coupled to the substrate support for processing.

In some embodiments described herein, an electrostatic chuck includes a ceramic puck having a plurality of mesas that are configured to support a substrate. The plurality of mesas may be formed on a top surface of the ceramic puck. In some embodiments, an electrode is disposed within the ceramic puck. The electrode may be configured to electrostatically clamp the substrate to the ceramic puck when energized with a clamping voltage (e.g., a chucking voltage). The clamping voltage may be sufficient to secure the substrate to the electrostatic chuck (e.g., to the ceramic puck of the electrostatic chuck) so that the substrate does not move during processing of the substrate. In some embodiments, the electrode includes a plurality of perforations. For example, the electrode may include voids (e.g., holes, etc.) in the electrode. In some embodiments, the voids may have a circular cross-section, but my have other shaped cross-sections in other embodiments. In some embodiments, the perforations are disposed beneath the mesas formed on the top surface of the ceramic puck. By including the perforations in the electrode beneath the mesas, the electrostatic clamping force at the mesa regions is reduced. The reduced clamping force may reduce or eliminate damage to the bottom surface of the substrate caused by conventional systems.

In some embodiments, an electrostatic chuck includes a plurality of electrode screens disposed within the ceramic puck between a chucking electrode and the top surface of the ceramic puck. In some embodiments, the electrode screens are disposed beneath the mesas formed on the top surface of the ceramic puck. In some embodiments, the chucking electrode does not include the perforations described above. Instead, the electrode screens act to "screen" the electrostatic clamping forced induced by the chucking electrode. In some embodiments, the electrode screens interfere with the electrostatic clamping force beneath the mesas to reduce the clamping force at the mesa regions. The reduced clamping force may reduce or eliminate damage to the bottom surface of the substrate caused by conventional systems. In some embodiments, a combination of perforations and screens are used at one or more mesas, and/or some mesas are associated with screens disposed beneath the mesas while other mesas are associated with perforations below those mesas.

Embodiments of the present disclosure provide advantages over conventional solutions. By providing an electrostatic chuck having a perforated chucking electrode and/or electrode screens, damage to substrate at mesa regions can be reduced. Additionally, contamination by small particles can be reduced using an electrostatic chuck as described herein because fewer particles may be generated. Further, substrate processes can be more accurately performed because substrates may not be bent (e.g., may be less bent) using an electrostatic chuck as described herein when compared to using a conventional electrostatic chuck. Moreover, reduction in damage and less particle contamination can lead to fewer scrapped substrate and therefore to increased overall system throughput with increased processed substrate accuracy.

FIG. 1 is a sectional view of one embodiment of a processing chamber 100 having a substrate support assembly 150 disposed therein. The processing chamber 100 may be any type of processing chamber, such as a deposition chamber, an etch chamber, an oxidation chamber, an implant chamber, and so on. While the substrate support assembly 150 is described as being an electrostatic chuck assembly or a heater assembly in some embodiments, the substrate support assembly may be replaced with other types of substrate support assemblies, such as a vacuum chuck assembly, a deposition heater assembly, a mechanical chuck assembly, a magnetic chuck assembly, a piezoelectric chuck assembly, a wafer carrier chuck assembly, an edge grip chuck assembly, a heated chuck assembly, a coolant chuck assembly, and so on. In some embodiments, the substrate support assembly 150 includes a puck assembly 166 (also referred to as a chuck) including one or more puck plates. The substrate support assembly 150 may additionally include two or more plates, where each plate may include zero or more different functional elements of the substrate support assembly (e.g., clamp electrodes, radiofrequency (RF) electrodes, main heating electrodes, auxiliary heating electrodes, cooling channels, and so on). The substrate support assembly 150 may further include a cooling plate 164, which may be formed from a metal or a dielectric material (e.g., ceramic). The puck assembly 166 and the cooling plate 164 may be separated by an interface layer including a metal, an organic material, a polymer, or combinations thereof.

The processing chamber 100 includes a chamber body 102 and a lid 104 that encloses an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In some embodiments, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 or nozzle that may be part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, the substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In some embodiments, the inner liner 118 may be fabricated from the same materials of the outer liner 116.

In some embodiments, the substrate support assembly 150 is part of a greater assembly 148 that includes the substrate support assembly 150 as well as a mounting plate 162 supporting a pedestal 152. In some embodiments, the substrate support assembly 150 further includes a thermally conductive base referred to herein as a cooling plate 164 coupled to a puck assembly 166 (also referred to as a puck plate assembly). In some embodiments, the cooling plate 164 is electrostatically coupled to the puck assembly 166 by energizing one or more clamping electrodes. The cooling plate 164 may alternatively be coupled to the puck assembly 166 using a dielectric material and/or by a bonding layer. The substrate support assembly 150 described in embodiments may be used for Johnsen-Rahbek and/or Coulombic electrostatic chucking of substrates in embodiments. In some embodiments, the puck plate assembly (e.g., chuck) 166 is electrostatically secured to the cooling plate using Johnsen-Rahbek and/or Coulombic electrostatic chucking. The substrate support assembly 150 may additionally or alternatively be used as a heater, such as a deposition heater that is configured to heat a support substrate 144 during a deposition process.

In some embodiments, a protective ring 146 is disposed over a portion of the puck assembly 166 at an outer perimeter of the puck assembly 166. In some embodiments, the puck assembly 166 (or one or more plates of the puck assembly 166) is coated with a protective layer 136. Alternatively, the puck assembly 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), YAlO3 (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The mounting plate 162 is coupled to the bottom 110 of the chamber body 102 and includes passages for routing utilities (e.g., fluids, power lines, sensor leads, etc.) to the cooling plate 164 and the puck assembly 166. The cooling plate 164 and/or puck assembly 166 may include one or more optional embedded heating elements 176, optional embedded thermal isolators 174 optional conduits 168, 170 to control a lateral temperature profile of the substrate support assembly 148, and/or other functional elements. In some embodiments, different functions of the puck assembly 166 may be divided across multiple plates. For example, one plate may include RF electrodes, one plate may include primary heating electrodes, one plate may include auxiliary heating electrodes, and so on. In some embodiments, multiple functions are provided by a single plate. For example, one plate of puck assembly 166 may include RF electrodes, clamp electrodes, and/or heating electrodes. In some embodiments, a thermal gasket 138 and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck assembly 166. The conduits 168, 170 and embedded heating elements 176 may be utilized to control the temperature of the puck assembly 166, consequently heating and/or cooling the puck assembly 166 and a substrate (e.g., a wafer) being processed. In some embodiments, the puck assembly 166 includes two separate heating zones that can maintain distinct temperatures. In some embodiments, the puck assembly 166 includes four or more different heating zones that can maintain distinct temperatures. The temperature of the puck assembly 166 and the thermally conductive base 164 may be monitored using multiple temperature sensors 190, 192, which may be monitored using a controller 195. The temperature sensors 190, 192 may be included in one plate of puck assembly 166 and/or in multiple plates of the puck assembly 166, which may be a same plate or plates or different plate or plates from the plate(s) containing the heating elements 176.

The puck assembly 166 may further include multiple gas passages such as grooves, mesas and other surface features that may be formed in an upper surface of a topmost plate of the puck assembly 166. The gas passages may be fluidly coupled to a source of a heat transfer (or backside) gas, such as He via holes drilled in the plates of the puck assembly 166. In operation, the backside gas may be provided at controlled pressure into the gas passages to enhance the heat transfer between the puck assembly 166 and the substrate 144.

In some embodiments, the puck assembly 166 include one or more clamping electrodes 180 controlled by a chucking power source 182. The clamping electrodes 180 may be used to clamp the puck assembly 166 to the cooling plate 164 and/or the wafer to the puck assembly 166. In some embodiments, the clamping electrode 180 used to electrostatically clamp the substrate to the puck assembly 166 includes multiple perforations beneath mesas formed on the top surface of the puck assembly 166. In some embodiments, the puck assembly includes multiple electrode screens within the puck assembly between the clamping electrode 180 and the top surface of the puck assembly. The multiple perforations and/or the multiple electrode screens may be to reduce the clamping force at the mesa regions to reduce damage to the bottom of a substrate.

The clamping electrodes 180 may be included in one or more plates of puck assembly 166. The clamping electrodes 180 (also referred to as clamp electrodes) may further be coupled to an RF power sources 184, 186 through a matching circuit 188 for maintaining a plasma formed from process and/or other gases within the processing chamber 100. In some embodiments, a different RF electrode or set of electrodes are connected to one or more RF power sources 184, 186 and used for maintaining a plasma. The RF electrode(s) may be included in one plate of puck assembly 166. The one or more RF power sources 184, 186 may be capable of producing an RF signal having a frequency from about 50 kHz to about 3 GHz and a power of up to about 10,000 Watts. In some embodiments, an RF signal is applied to the metal base, an alternating current (AC) is applied to the heater and a direct current (DC) is applied to the clamping electrode 180.

Figure 2:
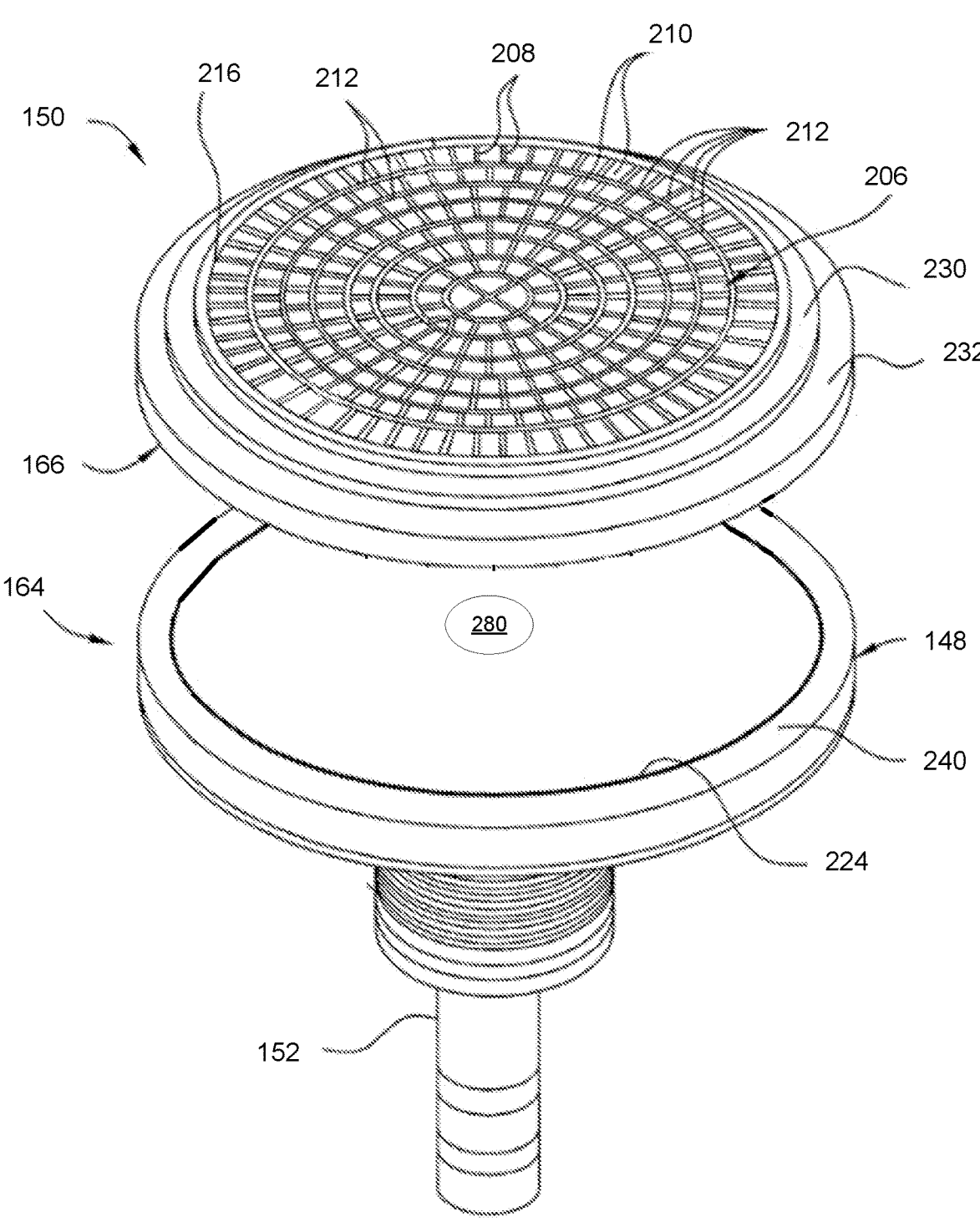
FIG. 2 depicts an exploded view of one embodiment of a substrate support assembly, according to aspects of the present disclosure.

FIG. 2 depicts an exploded view of one embodiment of the substrate support assembly 150. The substrate support assembly 150 includes the puck assembly 166 and the cooling plate 164 including the pedestal 152. In some embodiments, the cooling plate 164 may be attached to the puck assembly 166 using one or more clamp electrodes (e.g., clamp electrodes 180). The interior volumes within the substrate support assembly 150 may include open spaces 280 within the pedestal 152 for routing conduits and wiring.

In some embodiments, the puck assembly 166 and the dielectric cooling plate 164 can be bonded using a bonding layer including Ni, Ti, C, Si, a flexible graphite layer, an organic elastomer, Al, In, Ni, Ti, and/or an alloy including Ni—Ti or MoMg, or Cu—Ag or Al alloy. Examples of materials that may be used in forming the puck assembly 166 and the dielectric cooling plate 164 include niobium, aluminum oxide, aluminum nitride, single crystal alumina, or sapphire. The puck assembly 166 and may be formed using a hot press, a hot isostatic press, a green sheet, a gel cast, or a sol gel process, for example.

The puck assembly 166 may include one or more embedded functional elements, which may include a clamp electrode, a heating element, a zone heater, a pixelated heater, a radio frequency (RF) electrode, an RF filter, a gas channel, a cooling channel, or combinations thereof. In some embodiments, the puck assembly 166 may include a chucking electrode that can be energized to secure a substrate or wafer to the puck assembly 166. In some embodiments, the chucking electrode includes perforations (e.g., holes, etc.) beneath the mesas 210. For example, a perforation of the chucking electrode may be disposed beneath a mesa 210 to reduce the clamping force at the mesa region induced by the chucking electrode when energized. In some embodiments, the puck assembly 166 includes electrode screens between the chucking electrode and the mesas 210. For example, a electrode screen may be disposed beneath a mesa 210 to reduce interfere with and reduce the clamping force at the mesa region induced by the chucking electrode when energized. The cooling plate 164 may include one or more cooling loops or channels to circulate a cooling fluid (e.g., a coolant or a refrigerant or gas). The cooling plate 164 may further include one or more channels for a gas (e.g., inert gas) to flow therethrough. The puck assembly 166 and the dielectric cooling plate 164 may be formed of the same ceramic material, different ceramic materials, the same ceramic material with different purities, the same ceramic material with different grain sizes, different ceramic materials with different grain sizes, or different ceramic materials with different purities. Examples of materials that may be used in forming the puck assembly 166 and the cooling plate 164 include niobium, aluminum oxide, aluminum nitride, single crystal alumina, or sapphire.

In some embodiments, the puck assembly 166 has a disc-like shape having an annular periphery that may substantially match the shape and size of the substrate positioned thereon. An upper surface of the puck assembly 166 may have an outer ring 216, multiple mesas 206, 210 and channels 208, 212 between the mesas 210. In some embodiments, the puck assembly 166 includes an upper puck plate 230 bonded to the lower puck plate 232 by a metal bond, a ceramic bond, an organic bond, a polymer bond, or other type of bond.

The cooling plate 164 attached below the puck assembly 166 may have a disc-like main portion 224, which may accommodate an interface layer as described in the later sections, and an annular flange 240 extending outwardly from the main portion 224 and positioned on the pedestal 152. Additionally, the main portion 224 may include protrusions or grooves (not shown) that may correspond to grooves or protrusions formed on a bottom surface of the lower puck plate 232 for properly aligning the puck assembly 166 with the cooling plate 164. For example, a bottom surface of the chuck and a top surface of the cooling plate may include a mating feature to align the chuck with the cooling plate. In some embodiments, the cooling plate 164 may be fabricated of aluminum or another metal.

Figure 3:
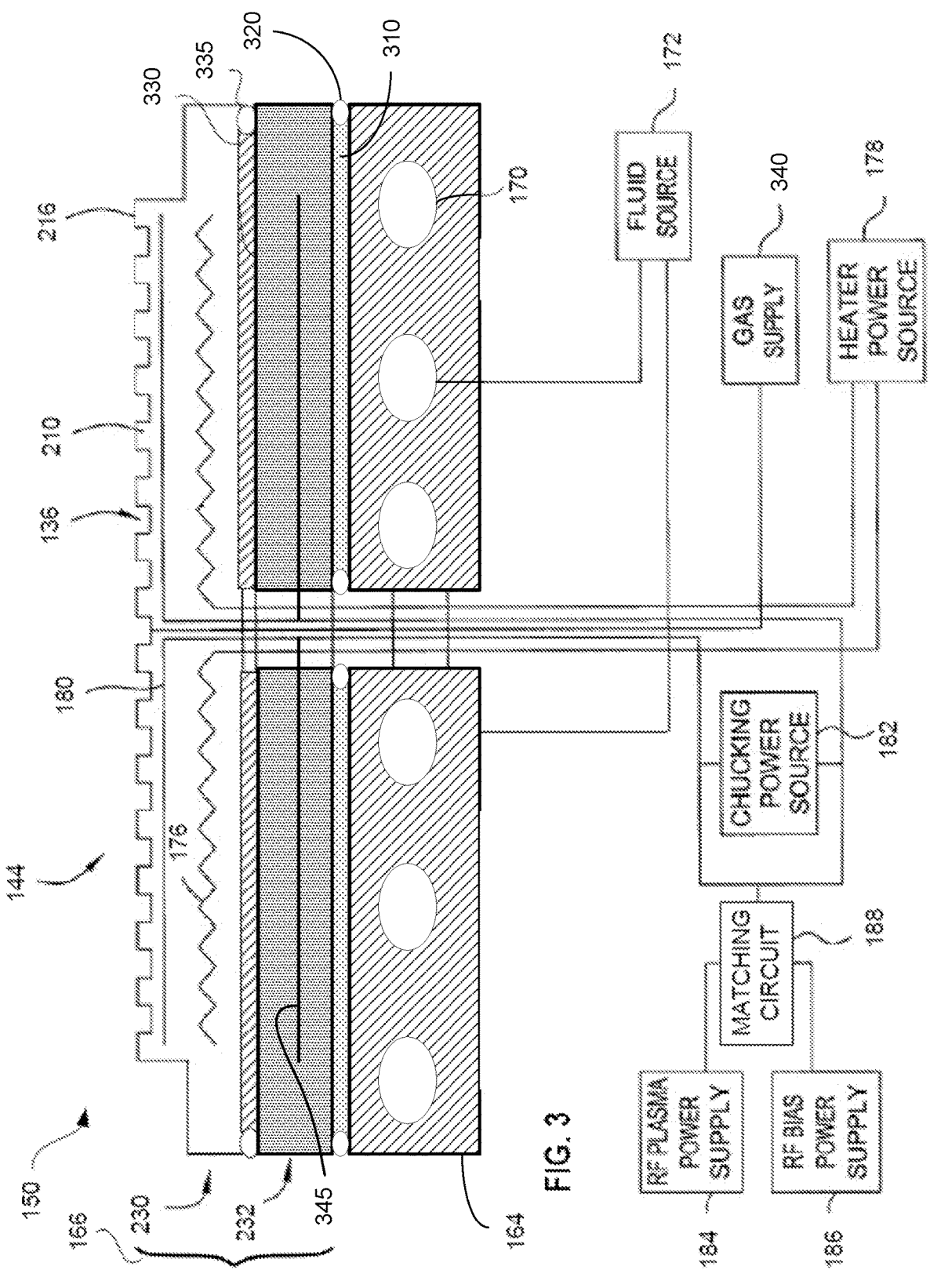
FIG. 3 depicts a sectional side view of one embodiment of a substrate support assembly, according to aspects of the present disclosure.

FIG. 3 depicts a sectional side view of one embodiment of a substrate support assembly 150. The substrate support assembly 150 includes a puck assembly 166 including one or more puck plates, such as two plates, three plates, four plates, five plates, and so on. In some embodiments, the puck assembly 166 may include a top plate 230 and a bottom plate 232. Puck plate 232 may be permanently bonded to the cooling plate 164 using a bonding layer 310. Alternatively, puck assembly 166 may include a single puck plate. Different techniques may be used to bond the puck plate 232 to the cooling plate 164. One technique that may be used for bonding is metal bonding. Polymer bonding, diffusion bonding, organic bonding, and so on may also be performed to bond plates together. In some embodiments, diffusion bonding is used as a method of metal bonding the bottom plate 232 to the cooling plate 164. Alternatively, fasteners such as bolts may be used to fasten the puck plate assembly 166 to the cooling plate. One or more o-rings 320 may surround bonding layer 310 to protect the bonding layer 310 contained between the puck plate 232 and cooling plate 164 in some embodiments.

The top plate 230 may include mesas 210, channels 212 and optionally an outer ring 216. In some embodiments, the puck plate 230 includes functional elements such as one or more clamping electrodes 180, one or more heating elements 176, and/or one or more RF electrodes (not shown). Alternatively, the clamping electrodes 180, heating elements 176, and RF electrodes may be disposed in different plates. The clamping electrodes 180 may be coupled to a chucking power source 182, and/or to an RF plasma power supply 184 and/or an RF bias power supply 186 via a matching circuit 188. The puck plates 230, 232 and/or other plates may additionally include gas delivery holes (not shown) through which a gas supply 340 pumps a backside gas such as He. Additionally, the puck plates 230, 232 and/or other plates may additionally include one or more cooling holes (not shown) for a cooling fluid to flow therethrough.

The puck plates 230, 232 and/or other plates may have a thickness of about 1-25 mm or more. The clamping electrodes 180 may be located about 0.25 mm from an upper surface of the puck plate 230, the heating elements 176 may be located about 1 mm under the clamping electrodes 180, and RF electrodes may be located about 0.5 mm under the heating elements 176 in one example. In some embodiments, the top plate 230 may have additional clamp electrodes, similar to clamp electrodes 180, that may be located closer to a bottom surface of top plate 230. The additional clamp electrodes may be used to secure the top plate 230 to the bottom plate 232, as described below. The heating elements 176 may be screen printed heating elements having a thickness of about 10-200 microns in some embodiments. Alternatively, the heating elements may be resistive coils that use about 1-3 mm of thickness of the puck plate 230 in some embodiments. In such an embodiment, the puck plate 230 may have a minimum thickness of about 5 mm. In some embodiments, the puck plates have thicknesses ranging from 1 mm to 10 mm, 2 mm to 8 mm, or other thicknesses. In embodiments, different puck plates may have the same or different thicknesses, which may range from 1-25 mm, for example.

The heating elements 176 are electrically connected to a heater power source 178 for heating the puck plate 230. The puck plate 230 may include electrically insulative materials such as AlN or Al$_2$O$_3$.

In some embodiments, an interface layer 330 may be used to separate the top plate 230 from the bottom plate 232. The interface layer 330 may have a coefficient of thermal expansion and/or thermal conductivity that is close to that of the top plate 230 and/or bottom plate 232. In some embodiments, interface layer 330 may include an organic material, such as a polymer. One or more o-rings 335 may surround interface layer 330 to keep the interface layer 330 contained between the puck plate 232 and puck plate 230.

The puck plate 232 is coupled to and in thermal communication with a cooling plate 164 having one or more conduits 170 (also referred to herein as cooling channels) in fluid communication with fluid source 172. In some embodiments, the cooling plate 164 is coupled to the puck plate 232 using a dielectric material (e.g., a ceramic layer). Larger separation may decrease heat transfer, and cause the interface between the puck assembly 166 and the cooling plate 164 to act as a thermal choke. In some embodiments, a conductive gas may be flowed into the conduits 170 to improve heat transfer between the puck assembly 166 and the cooling plate 164. In some embodiments, an o-ring or gasket is not used between puck assembly 166 and cooling plate 164. In some embodiments, a separation between puck assembly 166 and cooling plate 164 minimizes the contact area between the puck assembly 166 and the cooling plate 164.

In some embodiments, the plate 232 and the cooling plate 164 are not bonded together. In such embodiments, fasteners may be used to couple the plate 232 and the cooling plate 164 together. For example, plate 232 and cooling plate 164 may each include features for accommodating a threaded insert and/or ahead of a threaded fastener. The threaded fastener may then extend between the plate 232 and the cooling plate 164 and be tightened against the threaded insert in the cooling plate.

In one embodiment (not shown), a grafoil layer or other flexible graphite layer is disposed between the puck assembly 166 and the cooling plate 164. The flexible graphite may have a thickness of about 10-40 mil. The flexible graphite may be thermally conductive, and may improve a heat transfer between the puck assembly 166 and the cooling plate 164.

In some embodiments, the cooling plate 164 includes a base portion (not shown). In some embodiments, the cooling plate 164 includes a spring loaded inner heat sink connected to the base portion by one or more springs. The springs apply a force to press the inner heat sink against the puck assembly 166. A surface of the heat sink may have a predetermined roughness and/or surface features (e.g., mesas) that control heat transfer properties between the puck assembly 166 and the heat sink. Additionally, the material of the heat sink may affect the heat transfer properties. For example, an aluminum heat sink will transfer heat better than a stainless steel heat sink. In some embodiments, the heat sink includes a grafoil layer on an upper surface of the heat sink.

Figure 4C:
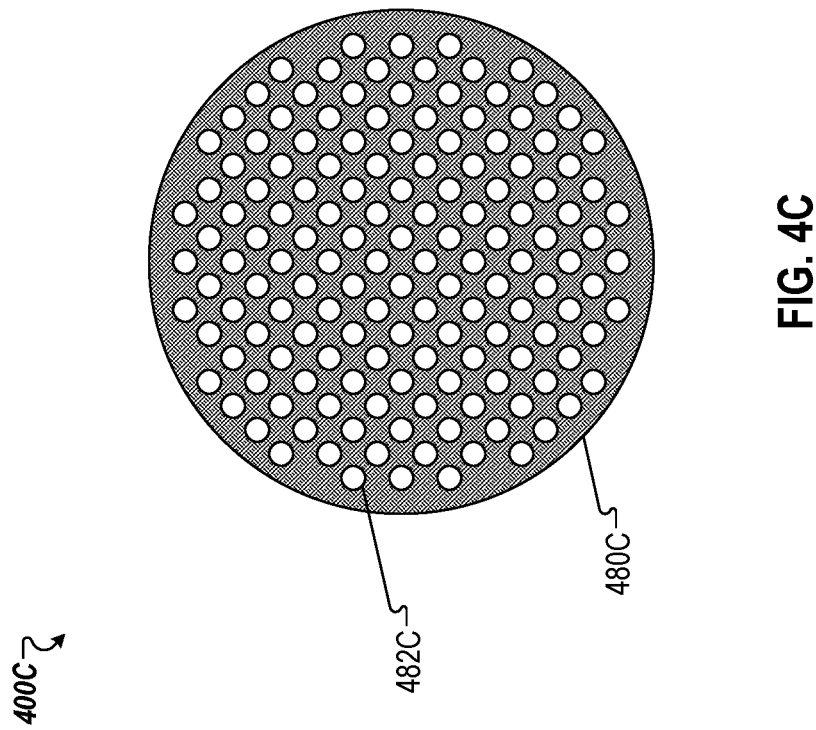
FIGS. 4A-4C depict an electrostatic chuck and perforated electrode, according to aspects of the present disclosure.
Figure 4A:
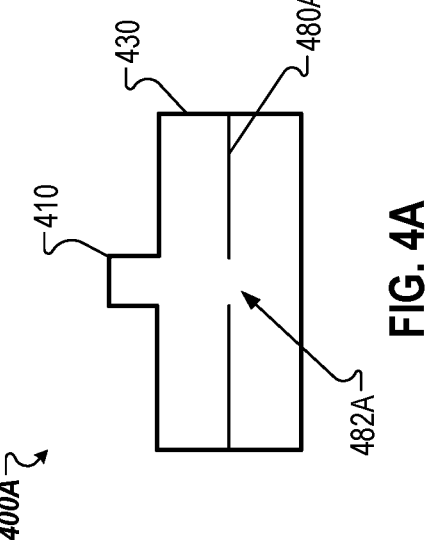
Figure 4B:
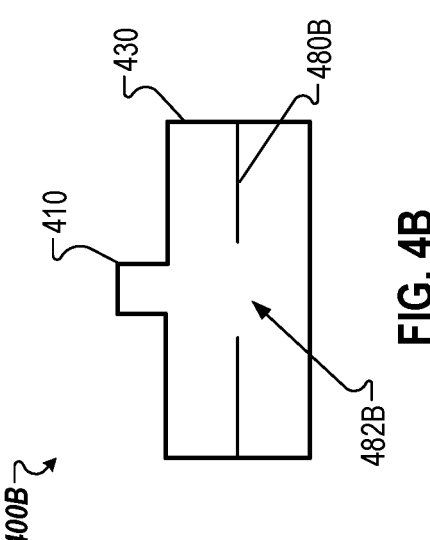

FIGS. 4A-4C depict an electrostatic chuck and perforated electrode, according to aspects of the present disclosure. FIG. 4A depicts a partial side cutaway view of an electrostatic chuck 400A. FIG. 4B depicts a partial side cutaway view of an electrostatic chuck 400B. FIG. 4C depicts a top-down view of a perforated electrode 400C. Referring to FIG. 4A, a representation of an electrostatic chuck 400A is shown. In some embodiments, an electrode 480A is included within a ceramic puck 430. Multiple mesas 410 may be included on a top surface of the ceramic puck 430 (although only one mesa 410 is shown in FIG. 4A). In some embodiments, electrode 480A includes a plurality of perforations 482A. In some embodiments, a perforation 482A may be disposed beneath a mesa 410. The perforation 482A may form a gap, hole, void, etc. in the electrode 480A. In some embodiments, the perforation 482A has a width that is narrower than the width of the mesa 410.

Referring to FIG. 4B, in some embodiments, the perforation 482B has a width that is wider than the width of the mesa 410. In some embodiments, the perforation formed in the electrode (e.g., electrode 480A or electrode 480B) has a width that is between approximately 5% and approximately 200% the width of the mesa 410. In some embodiments, the perforation has a width that is between approximately 25% and approximately 180% the width of the mesa 410. In some embodiments, the perforation has a width that is between approximately 50% and approximately 150% the width of the mesa 410. In some embodiments, the perforation has a width that is between approximately 75% and approximately 100% the width of the mesa 410. In some embodiments, the perforation has a width between 10 μm and 4,000 μm. In some embodiments, the perforation has a width between 20 μm and 2,000 μm. In some embodiments, the perforation has a width between 100 μm and 1,000 μm. In some embodiments, the perforation has a width between 10 μm and 100 μm. In some embodiments, the mesa 410 has a width between approximately 10 µm and 10 mm. In some embodiments, the mesa 410 has a width between approximately 50 µm and 2 mm.

In some embodiments, the electrodes (e.g., electrode 480A and electrode 480B) are disposed at a depth from the top surface of the ceramic puck 430 that is between approximately 50 µm and 2 mm. In some embodiments, the electrodes are disposed at a depth that is between approximately 50 µm and 1 mm. In some embodiments, the electrodes are disposed at a depth that is between approximately 100 µm and 300 µm.

Referring to FIG. 4C, in some embodiments, the electrode 480C may include a plurality of perforations 482C. In some embodiments, because the perforations 482C are disposed beneath the mesas 410, the perforations 482C are arranged in a lattice that matches the lattice arrangement of the mesas 410. In some embodiments, the mesas 410 are arranged in a triangular-lattice (e.g., hexagonal lattice), on a top surface of the ceramic puck 430. Therefore, the perforations 482C may be similarly arranged in a triangular-lattice. In some embodiments, the lattice may be an oblique lattice, a rhombic lattice, a square lattice, and/or a rectangular lattice.

Figure 5C:
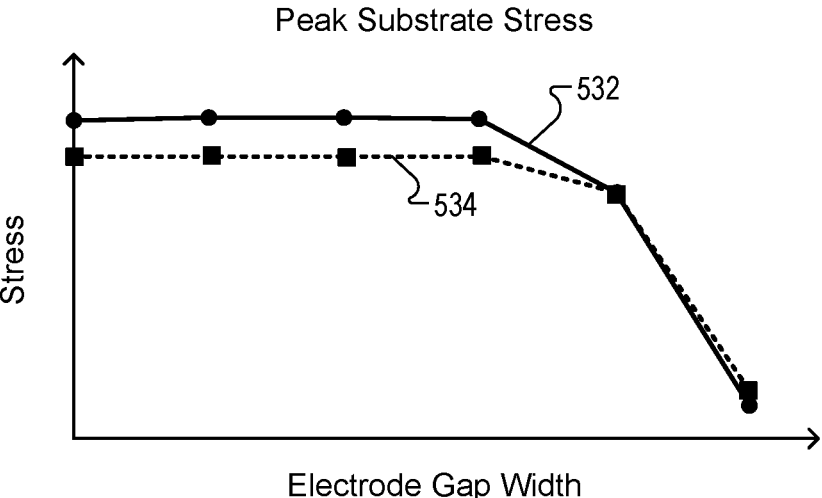

FIGS. 5A-5D are charts depicting the performance of an electrostatic chuck with perforated a perforated electrode, according to aspects of the present disclosure. Referring to FIG. 5A, a chart 500A depicting the average peak clamp pressure is shown with reference to electrode gap width. In some embodiments, reduction in pressure corresponds with reduction in damage to the bottom of a substrate when clamped on an electrostatic chuck. In some embodiments, as the electrode gap width (e.g., the width of the perforations in the electrode that are below mesas, such as the width of perforations 482A or 482B) is increased, clamp pressure at mesas decreases, which results in reduction in peak deformation of a substrate between mesas. In some embodiments, clamp pressure at mesas does not significantly decrease until a threshold electrode gap width is reached. For example, where the electrode gap has a width of between approximately 100 µm and approximately 1200 µm, the clamp pressure may be approximately constant. Where the electrode gap has a width of between approximately 1200 µm and approximately 3000 µm, the clamp pressure may decrease slightly. Where the electrode gap has a width greater than approximately 3000 µm, the clamp pressure may decrease significantly. A decrease in clamp pressure at mesas can be advantageous for reducing damage to a substrate. However, clamp pressure should not be reduced so much as to not securely clamp the substrate to the electrostatic chuck.

Referring to FIG. 5B, a chart 500B depicting the peak deformation between mesas is shown with reference to electrode gap width. In some embodiments, as the electrode gap width is increased, the median deformation of a substrate between mesas decreases. In some embodiments, peak deformation between mesas does not significantly decrease until a threshold electrode gap width is reached. For example, where the electrode gap has a width of between approximately 100 µm and approximately 1200 µm, peak deformation may be approximately constant. Where the electrode gap has a width of between approximately 1200 µm and approximately 3000 µm, the peak deformation may decrease slightly. Where the electrode gap has a width greater than approximately 3000 µm, the peak deformation may decrease significantly. A decrease in substrate deformation can be advantageous for reducing damage to the substrate and for maintaining process uniformity across the top surface of the substrate.

Referring to FIG. 5C, a chart 500C depicting peak substrate stress is shown with reference to electrode gap width. Plot 532 may show the magnitude of the stress at the mesas (e.g., at the regions of the substrate supported by the mesas) and plot 534 may show the magnitude of the stress between the mesas (e.g., at the regions of the substrate between those regions supported by the mesas). In some embodiments, as the electrode gap width is increased, stress at the mesas and between the mesas decreases. In some embodiments, peak substrate stress does not significantly decrease until a threshold electrode gap width is reached. For example, where the electrode gap has a width of between approximately 100 µm and approximately 1200 µm, peak substrate stress may be approximately constant. Where the electrode gap has a width of between approximately 1200 µm and approximately 3000 µm, the peak substrate stress may decrease slightly. Where the electrode gap has a width greater than approximately 3000 µm, the peak substrate stress may decrease significantly. A decrease in substrate stress can be advantageous for reducing damage to a substrate.

Figure 5D:
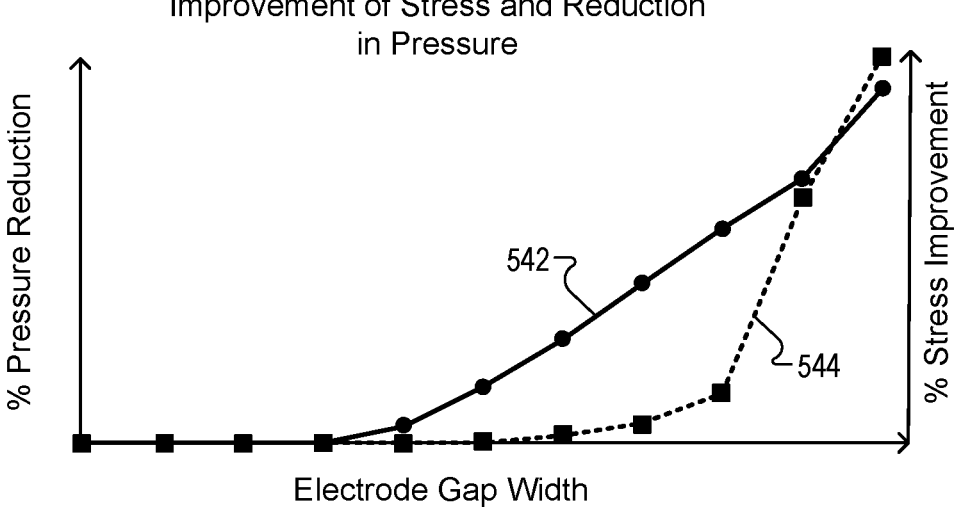

Referring to FIG. 5D, a chart 500D depicting an improvement of stress and reduction in clamping pressure in relation to conventional solutions is shown with reference to electrode gap width. Plot 542 may show the stress improvement at the mesas and plot 544 may show the reduction in clamp pressure. In some embodiments, as the electrode gap width is increased (e.g., as the amount of overlap between the mesa and the electrode is increased, etc.), the stress at the mesas improves and the clamp pressure reduces. In some embodiments, the clamp pressure is not significantly reduces as the electrode gap width is increased until a threshold electrode gap width is reached. For example, where the electrode gap has a width of between approximately 100 µm and approximately 1200 µm, stress may improve at least slightly with an insignificant reduction in clamp pressure. Where the electrode gap has a width of between approximately 1200 µm and approximately 3000 µm, the stress substantially improve and pressure may be reduced only slightly. Where the electrode gap has a width greater than approximately 3000 µm, the stress may improve significantly and pressure may degrade significantly. Improvement of the stress at the mesas may correspond to a reduction in damage to a substrate. In some embodiments, the electrode gap width (e.g., the electrode to mesa overlap, etc.) is engineered so that the improvement in stress and clamp pressure is optimized.

FIGS. 6A-6E depict an electrostatic chuck and bi-polar perforated electrode, according to aspects of the present disclosure. In some embodiments, a chucking electrode can be mono-polar, meaning the chucking electrode has a single pole that is energized with a chucking voltage. In some embodiments, a chucking electrode can be bi-polar, meaning the chucking electrode has two poles that are energized with opposite chucking voltages (e.g., a first pole is energized with a positive chucking voltage and the second pole is energized with a negative chucking voltage).

Referring to FIG. 6A, a partial side cutaway view of an electrostatic chuck 600A having a bi-polar electrode is shown. In some embodiments, the electrostatic chuck 600A may include a multi-polar electrode. In some examples, a mono-polar electrode has a single voltage V, a bi-polar electrode has two voltages V1 and V2, and a multi-polar electrode has multiple voltages V1, V2, Vn, etc. where n is the number of voltage sources. In some embodiments, electrostatic chuck 600A includes a ceramic puck 630 having mesas 610 formed on the top surface. A first pole 680A and a second pole 680B may be disposed within the ceramic puck 630. In some embodiments, the bi-polar electrode is formed by alternating the first pole 680A and the second pole 680B throughout the ceramic puck 630. In some embodiments, the first pole 680A spans the width of one mesa 610 and the second pole 680B similarly spans the width of one mesa 610.

In some embodiments, the first pole 680A and the second pole 680B are disposed within the ceramic puck 630 at a depth from the top surface of the ceramic puck 630 that is between approximately 50 μm and 2 mm. In some embodiments, the first and second poles are disposed at a depth that is between approximately 50 μm and 1 mm. In some embodiments, the first and second poles are disposed at a depth that is between approximately 100 μm and 300 μm. In some embodiments, the first pole 680A and the second pole 680B each have widths between approximately 0.5 mm and 25 mm. In some embodiments, the first pole 680A and the second pole 680B each have widths between approximately 0.5 mm and 15 mm. In some embodiments, the first pole 680A and the second pole 680B each have widths between approximately 5 mm and 10 mm.

Referring to FIG. 6B, a partial side cutaway view of an electrostatic chuck 600B having a perforated bi-polar electrode is shown. In some embodiments, the first pole 680A includes a perforation 682 beneath a mesa 610. In some embodiments, the second pole 680B includes a perforation 682 beneath a mesa 610. The first pole 680A and the second pole 680B may include perforations 682 at regions that are beneath each of the mesas 610. In some embodiments, the first pole 680A forms a first subset of perforations 682 and the second pole 680B forms a second subset of perforations 682. Each of the perforations 682 may be associated with a mesa 610.

In some embodiments, the perforations 682 have a width that is between approximately 0.05 mm and 1.5 mm. In some embodiments, the perforations 682 have a width that is between approximately 0.25 mm and 1.25 mm. In some embodiments, the perforations 682 have a width that is between approximately 0.5 mm and 1.0 mm. In some embodiments, the perforations 682 have a width that is between approximately 0.7 mm and 0.7 mm.

Referring to FIG. 6C, a partial side cutaway view of an electrostatic chuck 600C having a bi-polar electrode is shown. In some embodiments, the bi-polar electrode is formed by alternating the first pole 680A and the second pole 680B throughout the ceramic puck 630. In some embodiments, the first pole 680A spans the width of two mesas 610 and the second pole 680B similarly spans the width of two mesas 610.

Referring to FIG. 6D, a partial side cutaway view of an electrostatic chuck 600D having a perforated bi-polar electrode is shown. In some embodiments, the first pole 680A includes perforations 682 beneath mesas 610. In some embodiments, the second pole 680B includes perforations 682 beneath mesas 610. The first pole 680A and the second pole 680B may include perforations 682 at regions that are beneath each of the mesas 610.

Figure 6E:
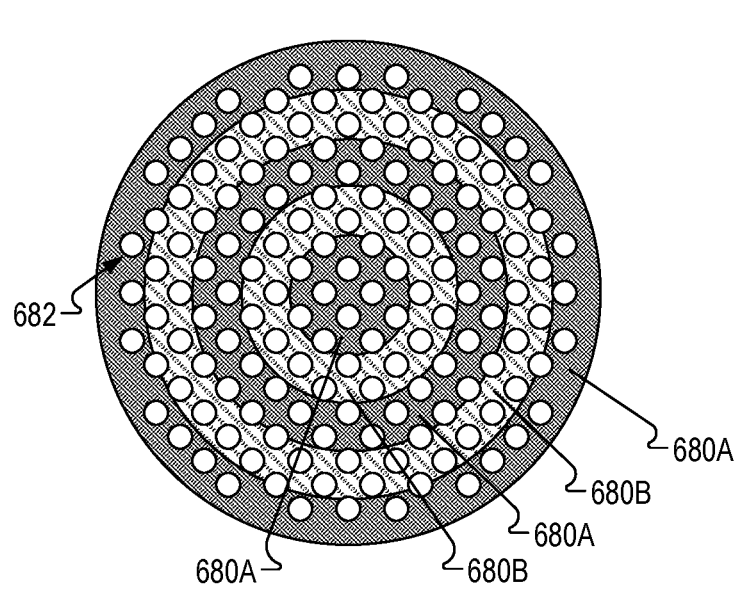

Referring to FIG. 6E, a top-down view of a perforated bi-polar electrode 600E is shown. In some embodiments, the bi-polar electrode 600E is made up of first pole 680A and second pole 680B. The first pole 680A and the second pole 680B may substantially form concentric circles. In some embodiments, each of the first pole 680A and the second pole 680B include multiple perforations 682.

FIGS. 7A-G depict an electrostatic chuck having a screened chucking electrode, according to aspects of the present disclosure. Referring to FIG. 7A, a partial side cutaway view of an electrostatic chuck 700A having a screened chucking electrode is shown. In some embodiments, a chucking electrode 780A is included within a ceramic puck 730. The chucking electrode 780A can be energized (e.g., with a chucking voltage) to secure a substrate to the electrostatic chuck 700A (e.g., for processing the substrate). In some embodiments, electrostatic chuck 700A includes an electrode screen 792A beneath a mesa 710. The electrode screen 792A may be formed by multiple perforations in the chucking electrode 780A. In some embodiments, the electrode screen 792A is formed by multiple concentric rings. The multiple perforations may form concentric circles beneath the corresponding mesa 710. In some embodiments, the electrode screen 792A is electrically insulated from the chucking electrode 780A. In some embodiments, the electrode screen 792A is disposed on a same plane with chucking electrode 780A. In some embodiments, the electrode screen 792A may disrupt an electromagnetic clamping force on a substrate (e.g., supported on the mesas 710) induced by the chucking electrode 780A. The electrostatic force may be reduced by the electrode screen 792A in a region proximate the mesa 710.

Referring to FIG. 7B, a partial side cutaway view of an electrostatic chuck 700B having a screened chucking electrode is shown. In some embodiments, an electrode screen 792B is included within the ceramic puck 730 on a plane between the chucking electrode 780B and the mesa 710. The electrode screen 792B may be disposed on a different plane than chucking electrode 780B. In some embodiments, the electrode screen 792B is disposed beneath the mesa 710. The electrode screen 792B may have a same diameter as the mesa 710, a smaller diameter than the mesa 710, or a larger diameter than the mesa 710. In some embodiments, the electrode screen 792B is substantially parallel to the chucking electrode 780B (e.g., as shown in FIG. 7B). In some embodiments, the electrode screen 792B is slanted/oblique (e.g., not parallel, etc.) to the chucking electrode 780B.

Referring to FIG. 7C, a partial side cutaway view of an electrostatic chuck 700C having a screened chucking electrode is shown. In some embodiments, multiple electrode screens 792C are included within the ceramic puck 730 on a plane between the chucking electrode 780B and the top surface of the ceramic puck 730. In some embodiments, a first electrode screen 792C is disposed beneath the mesa 710. A second electrode screen 792C and a third electrode screen 792C may be disposed in regions within the ceramic puck 730 on either side of the mesa 710. In some embodiments, each of the electrode screens 792C may be disposed on a same plane between the chucking electrode 780B and the top surface of the ceramic puck 730. In some embodiments, the electrode screens 792C are electrically connected to one another. In some embodiments, the electrode screens 792C are electrically insulated from one another.

Referring to FIG. 7D, a partial side cutaway view of an electrostatic chuck 700D having a screened chucking electrode is shown. In some embodiments, a electrode screen 792D is included within the ceramic puck 730 between the chucking electrode 780B and the top surface of the ceramic puck 730. The electrode screen 792D may be disposed beneath the mesa 710. In some embodiments, the electrode screen 792D does not include perforations, unlike electrode screens 792A, 792B, and/or 792C. In some embodiments, the electrode screen 792D is a screen element embedded within the ceramic puck 830. In some embodiments, the electrode screen 792D is electrically insulated from chucking electrode 780B. The electrode screen 792D may be a solid or perforated shape, such as a circular shape, beneath (e.g., directly beneath) mesa 710. Similar electrode screens may be disposed beneath other mesas of the puck. In some embodiments, the electrode screen 792D is charged. The electrode screen 792D may be electrically coupled to the chucking electrode 780B or may be electrically coupled to another source. In other embodiments, the electrode screen 792D is floating (e.g., not charged).

Referring to FIG. 7E, a top-down view of an electrostatic chuck 700E having a screened chucking electrode is shown. In some embodiments, a chucking electrode 780E is screened by an electrode screen 792E. In some embodiments, the electrode screen 792E is separated from the chucking electrode by a perforation gap 793E. The perforation gap 793E may completely surround the electrode screen 792E. The electrode screen 792E may be disposed beneath a mesa (e.g., mesa 710). In some embodiments, the electrostatic chuck 700E includes multiple electrode screens 792E, each separated from the chucking electrode 780E by a perforation gap 793E and each disposed beneath a mesa. In some embodiments, the electrode screen 792E is disposed at least partially within the same plane as chucking electrode 780E. In other embodiments, the electrode screen 792E is disposed in a different plane from chucking electrode 780E. In some embodiments, the electrode screen 792E is an electrode that has a neutral charge.

Referring to FIG. 7F, a top-down view of an electrostatic chuck 700F having a screened chucking electrode is shown. In some embodiments, a chucking electrode 780F includes a tongue 781 that is partially separated from the chucking electrode 780F by perforation gap 793F. In some embodiments, perforation gap 793F substantially forms a C-shape. In some embodiments, the perforation gap 793F alters/ eliminates a screening field to electrically screen the chucking force from the chucking electrode 780F. In some embodiments, the tongue 781 is disposed beneath a mesa (e.g., mesa 710). In some embodiments, the electrostatic chuck 700F includes multiple tongues 781 in the chucking electrode 780F, each partially separated from the chucking electrode 780F by a respective perforation gap 793F and each disposed beneath a mesa. In some embodiments, the tongue 781 is disposed at least partially within the same plane as chucking electrode 780F. In some embodiments, the tongue 781 is disposed at least partially within a different plane from chucking electrode 780F. In some embodiments, the tongue 781 is electrically coupled to the chucking electrode 780F. The tongue 781 may therefore have the same electrical charge as the remainder of the chucking electrode 780F.

Referring to FIG. 7G, a top-down view of an electrostatic chuck 700G having a screened chucking electrode is shown. In some embodiments, the perforation gap 793G is segmented. For example, one or more fingers 783 may connect the tongue 781 with the chucking electrode 780F. The fingers 783 may be radially distributed around the tongue 781. For example, the tongue 781 may be coupled with the chucking electrode 780F by two fingers 783 or by four finger 783 as shown in FIG. 7G.

FIGS. 8A-8D depict an electrostatic chuck having a screened chucking electrode proximate the seal band, according to aspects of the present disclosure. Referring to FIG. 8A, a partial side cutaway view of an electrostatic chuck 800A is shown. In some embodiments, a ceramic puck 830 includes multiple mesas 810 formed on a top surface. Proximate the outer periphery of the ceramic puck 830, a seal band 816 may be formed. A chucking electrode 880 may be included within the ceramic puck 830. In some embodiments, the chucking electrode 880 substantially overlaps with the seal band 816. For example, the chucking electrode 880 may extend substantially into the region of the ceramic puck 830 beneath the seal band 816. In some embodiments, chucking electrode 880 lacks perforations beneath mesas that are less than a threshold distance from the outer periphery of the ceramic puck 830. Chucking electrode 880 may include perforations beneath mesas that are disposed more than the threshold distance from the outer periphery. In some embodiments, the threshold distance is between approximately 0.5 mm and 15 mm. In some embodiments, the threshold distance is between approximately 0.75 mm and 10 mm. In some embodiments, the threshold distance is between approximately 1 mm and 5 mm. In some embodiments, the threshold distance is between approximately 1.5 mm and 4 mm. In some embodiments, the threshold distance is between approximately 2 mm and 3 mm. In some embodiments, the threshold distance is between 5 mm and 10 mm. Mesas less than the threshold distance from the outer periphery of the ceramic puck 830 may not have an associated perforation in the chucking electrode 880.

The chucking electrode 880 may be energized to electrostatically clamp a substrate to the top surface of the ceramic puck 830. For example, when the chucking electrode 880 is energized, an electrostatic force may be induced which clamps a substrate to the ceramic puck 830. The substrate may be supported by the seal band 816 and/or the mesas 810.

Referring to FIG. 8B, a partial side cutaway view of an electrostatic chuck 800B is shown. In some embodiments, the chucking electrode 880 only partially overlaps with the seal band 816. For example, the chucking electrode 880 may extend only partially into the region of the ceramic puck 830 beneath the seal band 816. When electrostatic chuck 800B is compared to electrostatic chuck 800A, the size of the seal band 816 may be reduced.

Referring to FIG. 8C, a partial side cutaway view of an electrostatic chuck 800C is shown. In some embodiments, a electrode screen 886 is included within the ceramic puck 830 beneath the seal band 816. In some embodiments, the electrode screen 886 overlaps with the chucking electrode 880. In some embodiments, the electrode screen 886 is disposed on a plane between the chucking electrode 880 and the seal band 816. In some embodiments, the electrode screen 886 is one of electrode screen 886A, 886B, 886C, or 886D. In some embodiments, electrode screen 886A is substantially parallel to chucking electrode 880. In some embodiments, electrode screen 886B forms a corner-shaped cross-section. In some embodiments, electrode screen 886C forms an I-shaped cross-section. The center of electrode screen 886C may be disposed on the same plane as chucking electrode 880. In some embodiments, electrode screen 886D is slanted/oblique (e.g., not parallel) with respect to chucking electrode 880. In some embodiments, the electrode screen 886 is electrically insulated from the chucking electrode 880. In some embodiments, the electrode screen 886 is electrically coupled to the chucking electrode 880. In some embodiments, the electrode screen 886 is to reduce the electrostatic force induced by the chucking electrode 880 at regions proximate the seal band 816. Inclusion of the electrode screen 886 may prevent arcing of electrical current from the chucking electrode 880. To further avoid arcing, in some embodiments, the ceramic puck 830 is made up of a ceramic material having a dielectric coefficient that is more than 50 kilovolts per millimeter.

Referring to FIG. 8D, a partial side cutaway view of an electrostatic chuck 800D is shown. In some embodiments, a control electrode 888 is included within the ceramic puck 830 in a plane beneath the chucking electrode 880. In some embodiments, the chucking electrode 880 includes perforations. The control electrode 888 may also include perforations that alternate with the perforations of the chucking electrode 880. For example, the control electrode 888 may be disposed beneath the perforations of the chucking electrode 880 while the chucking electrode 880 may be disposed above the perforations of the control electrode 888. In some embodiments, the control electrode 888 is electrically insulated from the chucking electrode 880. In some embodiments, voltage to the control electrode 888 can be modulated to control the electrostatic force induced by the chucking electrode 880 (e.g., when energized) on a substrate supported on the mesas 810 and/or the seal band 816.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An electrostatic chuck, comprising:
a ceramic puck comprising a plurality of mesas configured to support a substrate; and
an electrode disposed within the ceramic puck and configured to electrostatically clamp the substrate to the ceramic puck responsive to being energized with a clamping voltage, wherein the electrode comprises multiple concentric rings and forms a plurality of perforations, and wherein at least a first perforation of the plurality of perforations is disposed beneath at least one mesa of the plurality of mesas and is formed by two or more of the multiple concentric rings.

2. The electrostatic chuck of claim 1, wherein at least one perforation of the plurality of perforations has a first width that is between approximately 5% and approximately 200% a second width of one of the plurality of mesas.

3. The electrostatic chuck of claim 2, wherein the first width is between 10 μm and 4,000 μm.

4. The electrostatic chuck of claim 2, wherein the second width is between approximately 10 μm and 10 mm.

5. The electrostatic chuck of claim 1, wherein the plurality of mesas form one or more of a triangular-lattice, an oblique lattice, a rhombic lattice, or a rectangular lattice on a top surface of the ceramic puck.

6. The electrostatic chuck of claim 1, wherein the electrode comprises a bi-polar electrode, wherein a first pole of the bi-polar electrode forms a first subset of the plurality of perforations associated with a first subset of the plurality of mesas, and wherein a second pole of the bi-polar electrode forms a second subset of the plurality of perforations associated with a second subset of the plurality of mesas.

7. The electrostatic chuck of claim 6, wherein the first pole of the bi-polar electrode forms a first ring of the multiple concentric rings, and wherein the second pole of the bi-polar electrode forms a second ring of the multiple concentric rings.

8. The electrostatic chuck of claim 1, wherein each of the plurality of perforations are disposed beneath one of the plurality of mesas.

9. The electrostatic chuck of claim 1, wherein the ceramic puck comprises a seal band proximate an outer periphery of the ceramic puck, wherein the electrode overlaps with the seal band, and wherein the plurality of perforations are disposed beneath a subset of the plurality of mesas that are disposed more than a threshold distance from the outer periphery of the ceramic puck.

10. The electrostatic chuck of claim 9, wherein the threshold distance is between approximately 2 mm and approximately 15 mm.

11. The electrostatic chuck of claim 9, wherein the ceramic puck is made up of a ceramic material having a dielectric coefficient of more than 50 kilovolts per millimeter.

12. An electrostatic chuck, comprising:
a ceramic puck comprising a plurality of mesas on a top surface of the ceramic puck;
a chucking electrode disposed within the ceramic puck; and
a plurality of electrode screens disposed within the ceramic puck between the chucking electrode and the top surface of the ceramic puck, wherein at least one electrode screen of the plurality of electrode screens comprises multiple concentric rings disposed beneath at least one mesa of the plurality of mesas.

13. The electrostatic chuck of claim 12, wherein the plurality of electrode screens are configured to disrupt an electromagnetic clamping force between the chucking electrode and a substrate supported on the plurality of mesas.

14. The electrostatic chuck of claim 12, wherein the plurality of electrode screens are disposed in a same plane as the chucking electrode or within a different plane between the chucking electrode and the top surface of the ceramic puck.

15. The electrostatic chuck of claim 12, wherein at least one of the plurality of electrode screens is formed by multiple perforations within the chucking electrode.

16. The electrostatic chuck of claim 12, wherein the at least one of the plurality of electrode screens has a first width that is between approximately 5% and approximately 200% a second width of one of the plurality of mesas.

17. The electrostatic chuck of claim 12, wherein at least one of the plurality of electrode screens comprises a screen element embedded in the ceramic puck beneath one of the plurality of mesas.

18. A process chamber, comprising:
an electrostatic chuck, comprising:

a ceramic puck comprising a plurality of mesas config-
ured to support a substrate; and a chucking electrode disposed within the ceramic puck
and configured to electrostatically clamp the substrate
to the ceramic puck, wherein the chucking electrode
comprises multiple concentric rings and forms a plu-
rality of perforations, and wherein at least a first
perforation of the plurality of perforations is disposed
beneath at least one mesa of the plurality of mesas and
is formed by two or more of the multiple concentric
rings.

19. The process chamber of claim 18, wherein at least one
perforation of the plurality of perforations has a first width
that is between approximately 5% and approximately 200%
a second width of one of the plurality of mesas.

20. The process chamber of claim 19, wherein the first
width is between 10 µm and 4,000 µm.

\* \* \* \* \*